(12) United States Patent
Iorga

(10) Patent No.: US 9,537,475 B1
(45) Date of Patent: Jan. 3, 2017

(54) PHASE INTERPOLATOR DEVICE USING DYNAMIC STOP AND PHASE CODE UPDATE AND METHOD THEREFOR

(71) Applicant: Rambus Inc., Sunnyvale, CA (US)

(72) Inventor: Cosmin Iorga, Newbury Park, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/989,323

(22) Filed: Jan. 6, 2016

(51) Int. Cl.
  *H03K 3/00* (2006.01)
  *H03K 5/13* (2014.01)
  *H03K 5/00* (2006.01)

(52) U.S. Cl.
  CPC ....... *H03K 5/13* (2013.01); *H03K 2005/00286* (2013.01)

(58) Field of Classification Search
  CPC ................... H03K 2005/00286; H03H 11/22; G06F 1/10
  USPC .......................... 327/238, 237, 239, 259, 291
  See application file for complete search history.

(56) References Cited

U.S. PATENT DOCUMENTS

| 8,487,683 B1* | 7/2013 | Krishna | H03K 5/13 327/239 |
| 2008/0164928 A1* | 7/2008 | Rausch | H03H 11/20 327/258 |

* cited by examiner

*Primary Examiner* — Lincoln Donovan
*Assistant Examiner* — Thomas Skibinski
(74) *Attorney, Agent, or Firm* — Lowenstein Sandler LLP

(57) ABSTRACT

A method and device for dynamically updating a phase interpolator circuit module using an update control circuit module. The method can include providing the phase interpolator with a set of input clock phases to produce a clock signal. The update control module can generate a blanking signal in response to an update signal and apply an update process that stops an old clock output signal after a last clock pulse. The update control module can then update phase select multiplexers for a rising edge integrator and falling edge integrator according to a new phase interpolator code. The update control module can determine a phase jump code and then release the blanking signal during a discharge time interval of the rising edge integrator following a phase jump duration according to the phase jump code. Afterwards, the phase interpolator module can generate the new clock output signal without producing glitches.

20 Claims, 11 Drawing Sheets

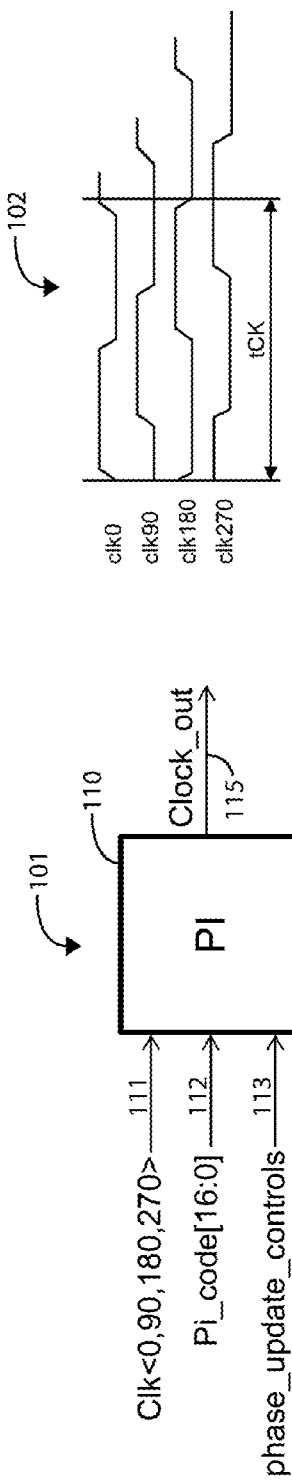
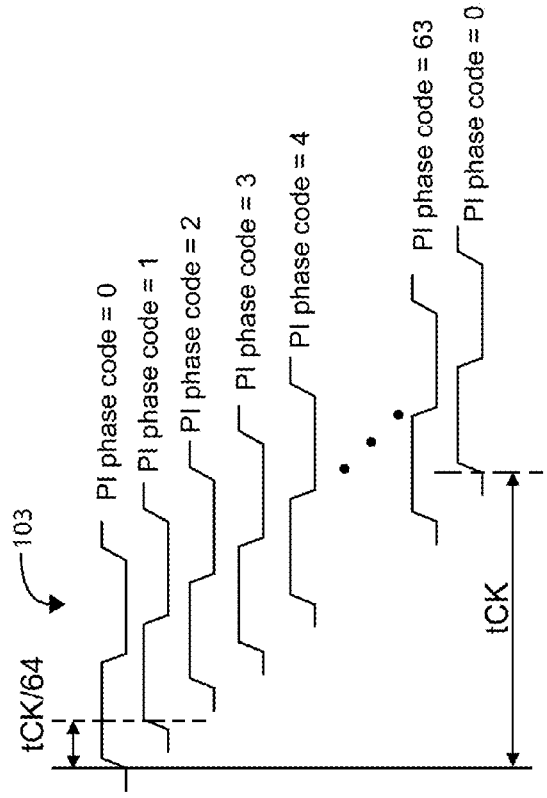
FIGURE 1B
FIGURE 1C
FIGURE 1A

PHASE INTERPOLATOR DEVICE USING DYNAMIC STOP AND PHASE CODE UPDATE AND METHOD THEREFOR

CROSS-REFERENCES TO RELATED APPLICATIONS

N/A

BACKGROUND OF THE INVENTION

The present invention relates to communication systems, memory systems, and integrated circuit (IC) devices.

Over the last few decades, the use of communication networks has exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

CMOS technology is commonly used to design communication and memory systems. As CMOS technology is scaled down to make circuits and systems run at higher speed and occupy smaller chip (die) area, the operating supply voltage is reduced for lower power. An important factor in device operations is the phase interpolation of clock signals to maintain synchronization of various electronic devices in communication systems. Failure to adjust clock signals without glitches can render systems non-functional. Conventional techniques for updating the phase interpolation of a communications system take too long or are prone to glitching. Limitations such as these provide significant challenges to the continued improvement of communication systems scaling and performance.

Accordingly, improvements to update techniques for phase interpolation in integrated circuit devices are highly desirable.

BRIEF SUMMARY OF THE INVENTION

The present invention relates to communication systems, memory systems, and integrated circuit (IC) devices. More particularly, the present invention provides several methods and circuit devices for dynamically updating a phase interpolator circuit module.

In an embodiment, the present invention provides a phase interpolator circuit device including a phase interpolator circuit module and an update control circuit module. The phase interpolator circuit module can be configured to generate one of 64 unique output phases by interpolating between pairs of four quadrature input phases from a global clock distribution or by implementing a bypass mode to pass one of the four quadrature input phases straight to the phase interpolator output.

These phases can be selected by a 17-bit mixed code including 2 binary-coded bits, which can be the 2 MSBs (Most Significant Bits), and 15 thermal code bits. The 2 binary-coded bits select the quadrature phases to interpolate, while the 15 thermal code bits configure the interpolation ratio between the selected quadrature phases. Also, as the quadrature phases are interpolated according to the thermal code, the interpolated signal inverts across every phase quadrant boundary to allow for a glitch-less clock operation when the phase code increments or decrements by one phase step.

In various embodiments, a method can include updating the phase of the phase interpolator circuit module in less than 2.5 clock cycles (tCK) without any short pulse glitch. More specifically, the phase interpolator can be configured to gate its clock output without generating a glitch and restart clock output with a new phase within 1.5 and 2.5 clock cycles after the last rising edge of the clock output according to a previous phase.

The phase interpolator is also configured to support the JEDEC (Joint Electron Device Engineering Council) test frequency band functionality. In a specific embodiment, a separate frequency band detector enables the bypass mode at a lower end of the JEDEC test frequency band. The phase interpolator circuit device also implements an idle mode and a deep power-down mode. The idle mode can be configured for short exit latency, while the deep power-down mode can be configured for longer exit latency. In a specific embodiment, the phase interpolator circuit device implements a F2I (frequency-to-current) circuit to produce an interpolating integrator bias. The F2I implements the deep power-down mode, whereas an update control circuit module implements the idle mode, or power throttled mode, in the phase interpolator circuit device.

In an embodiment, the present invention provides a method and device for dynamically updating a phase interpolator circuit module using a phase update circuit module. In the method, the phase interpolator can receive a set of input clock phases. This set of input clock phases can include four input clock phases nominally spaced apart by 90 degrees. The update control circuit module can receive a new phase interpolator code and a phase interpolator update signal. The update control module can generate a blanking signal in response to the update signal, which applies the update process of the present invention.

In an embodiment, the update process can include stopping an old clock output signal of the phase interpolator module after a last clock pulse of the old clock signal in response to the blanking signal. This old clock signal is characterized by an old phase interpolator code. The update control module can then update phase select multiplexers for a rising edge integrator and falling edge integrator, both of the phase interpolator modules, according to the new phase interpolator code. The update to the rising edge integrator follows a last rising edge of the old clock signal, while the update to the falling edge integrator follows a last falling edge of the old clock signal.

In an embodiment, the update control module determines a phase jump code. This phase jump code can correspond to a quadrant phase and a cycle number. The update control module then releases the blanking signal during a discharge time interval of the rising edge integrator. This release of the blanking signal occurs after a phase jump duration corresponding to the phase jump code that as previously determined. The use of the phase jump code facilitates the glitch-less clock signal update by providing precisely calculated phase jump delays according to all possible interpolation conditions for the phase interpolator module. Following the blanking signal release, the phase interpolator module can generate the new clock output signal.

Many benefits are recognized through various embodiments of the present invention. Such benefits include a quick and efficient technique for updating a phase interpolator circuit module substantially free from signal glitches that can render the device non-functional. In addition to fast, glitch-free output phase switching and clock gating, the phase interpolator circuit device and methods of operating therefor also exhibit high linearity, low jitter, low static duty cycle distortion, low insertion delay variation, as well as others. Other benefits will be recognized by those of ordinary skill in the art that the mechanisms described can be applied to other IC systems as well.

BRIEF DESCRIPTION OF THE DRAWINGS

FIG. 1A is a simplified block diagram of a phase interpolator circuit module according to an embodiment of the present invention.

FIG. 1B is a simplified timing diagram of a set of input clock signals of the phase interpolator circuit module of FIG. 1A.

FIG. 1C is a simplified timing diagram of set of output clock signals of the phase interpolator circuit module of FIG. 1A.

DETAILED DESCRIPTION OF THE INVENTION

Figure 2:
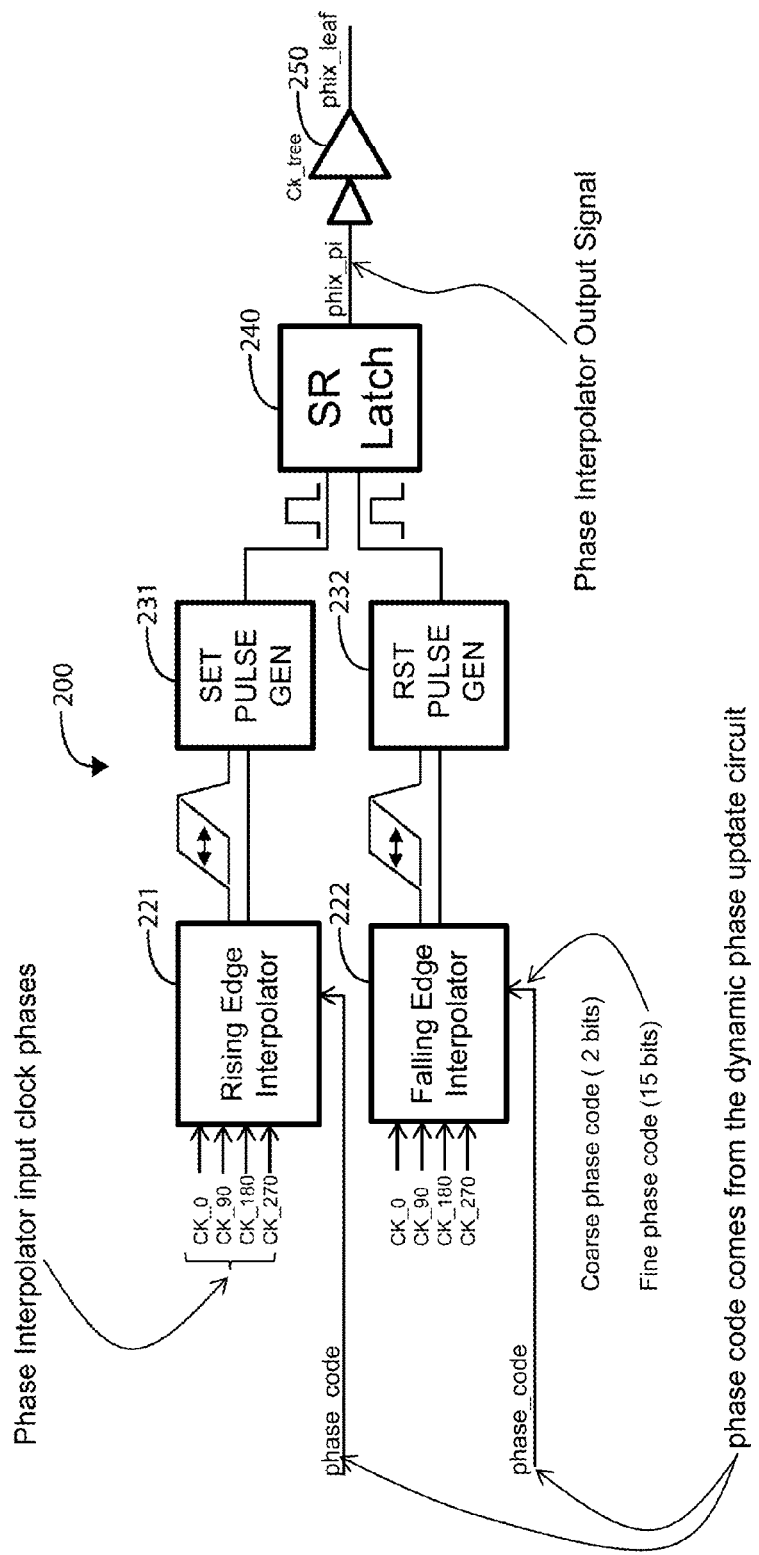
FIG. 2 is a simplified block diagram of a phase interpolator circuit module according to an embodiment of the present invention.

The present invention relates to communication systems, memory systems, and integrated circuit (IC) devices. More particularly, the present invention provides several methods and circuit devices for dynamically updating a phase interpolator circuit module.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

In various embodiments, the present invention provides several methods and circuit devices for dynamically updating a phase interpolator circuit module. The method can include updating the phase of the phase interpolator circuit module in less than 2.5 clock cycles without any short pulse glitch. In a specific embodiment, the present invention provides a phase update circuit that performs a technique involving updating sequentially first the rising edge then the falling edge with the decision of inserting an artificial falling edge while temporarily disabling the rising and falling edge generators. Further details of the various embodiments are further described below.

FIG. 1A is a simplified block diagram of a phase interpolator circuit module 101 according to an embodiment of the present invention. As shown, circuit block 110 represents a phase interpolator circuit module, which can be used in a communications circuit system or a data buffer circuit system for changing clock signal phases. This block 101 receives four input clock phases 111 that are nominally spaced apart by 90 degrees (CLK<0, 90, 180, 270>). These input clock phases can be provided from a global clock distribution network. This block 101 also takes a phase interpolator (PI) code 112 and a phase update control signal 113 as inputs and is coupled to a current source 114. The phase interpolator circuit block 101 outputs an output clock signal 115

FIG. 1B is a simplified timing diagram 102 of a set of input clock signals of the phase interpolator circuit module of FIG. 1A. This timing diagram 102 shows the four nominally spaced clock phases described previously (CLK<0, 90, 180, 270>). As shown, these clock phases are spaced apart by 90 degrees from. The length of a single clock phase is marked by tCK on the diagram across all four represented clock phases.

FIG. 1C is a simplified timing diagram 103 of set of output clock signals of the phase interpolator circuit module of FIG. 1A. In an embodiment, the phase interpolator circuit module (101 of FIG. 1A) can produce one of 64 possible output phases based on the PI control code [16:0] (112 of FIG. 1A). Timing diagram 103 shows the various output phases depending on the value of the PI_code[16:0], showing the range from 0 to 63. Both the length of a single clock phase (tCK) and the length of the phase shift (tCK/64) between each output are shown in the diagram.

In a specific embodiment, the PI interpolates two of the four global quadrature clock phases according to the 17-bit mixed code phase control setting on the PI_code[16:0] pins shown in FIG. 1A. As an example, a phase setting of zero interpolates 100% of the "0 degree" global clock phase (CLK 0). Non-zero phase settings interpolate differently in order to produce an output that delayed by 1 to 63 phase steps, with a nominal phase step size of tCK/64, from the "0 degree" global clock phase depending on the PI code.

In a specific embodiment, the PI code is a thermal phase code that inverts the signal when it crosses a phase quadrant boundary. This process allows any single-step phase change, even those crossing a quadrant boundary, to occur without glitching the clock or causing a glitch in the clock signal. Any such phase change either changes the interpolator weighting or changes the zero-weighted quadrature phase, which is shown in the phase encoding table (FIG. 1C).

FIG. 2 is a simplified block diagram of a phase interpolator circuit module 200 according to an embodiment of the present invention. This module 200 can provide a more detailed embodiment of circuit block 101 as shown previously in FIG. 1A. As shown, the module 200 includes the phase interpolator input clock phases (CLK<0, 90, 180, 270>) coupled to both the rising and falling edge multiplexers 211, 212. Each of the interpolators 221, 222 are coupled to a pulse generator. The rising edge interpolator 221 is coupled to the set pulse generator 231, while the falling edge interpolator 222 is coupled to the reset pulse generator 232. Both of these pulse generators 231, 232 are coupled to an SR latch 240, which provides the phase interpolator output signal. The output signal can be fed into an amplifier 250.

In an embodiment, each of these interpolators 221, 222 takes the phase code input, which can be the 17-bit mixed code described previously. In a specific embodiment, this phase code can include a coarse phase code and a fine phase code. As noted on the diagram, the coarse phase code consists of 2 bits and the fine phase code consists of 15 bits. The phase code signal can be provided by a phase update circuit module, which is configured to perform a dynamic update without causing a glitch in the output clock signal.

Figure 3:
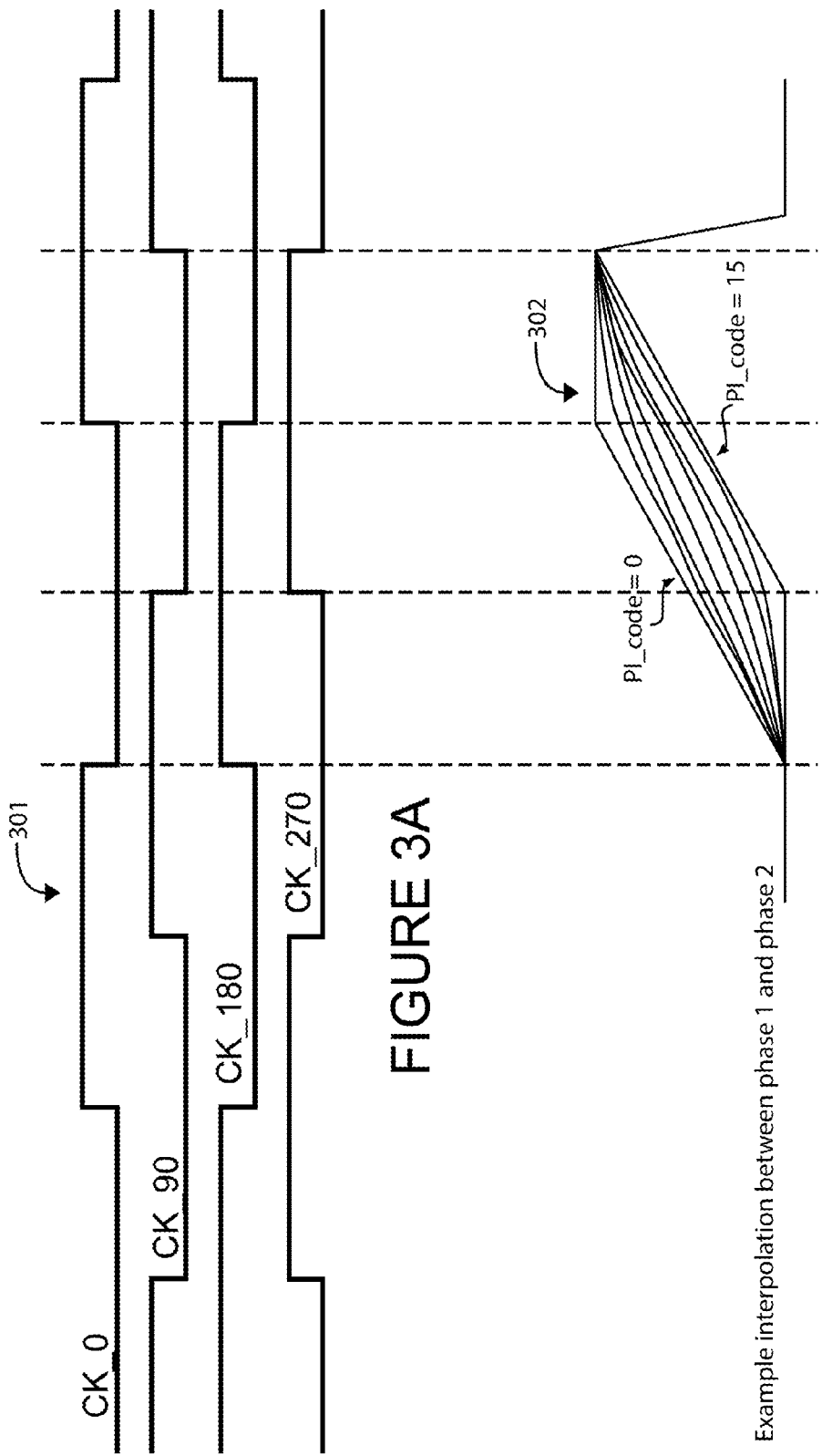
FIGS. 3A and 3B are simplified timing diagrams illustrating the interaction of the input clock signals (FIG. 3A) with the output clock signals (FIG. 3B) according to an embodiment of the present invention.

FIGS. 3A and 3B are simplified timing diagrams illustrating the interaction of the input clock signals (FIG. 3A) with the output clock signals (FIG. 3B) according to an embodiment of the present invention. As shown, timing diagram 301 is a similar diagram to FIG. 1B, which shows the four global clock phases. Timing diagram 302 shows various interpolations of the global clock signals based on the PI code provided from the phase update circuit module. As an example, this diagram 302 shows the interpolation between phase 1 and phase 2 signals to provide the various phase steps based on PI codes 0 through 15.

Figure 4:
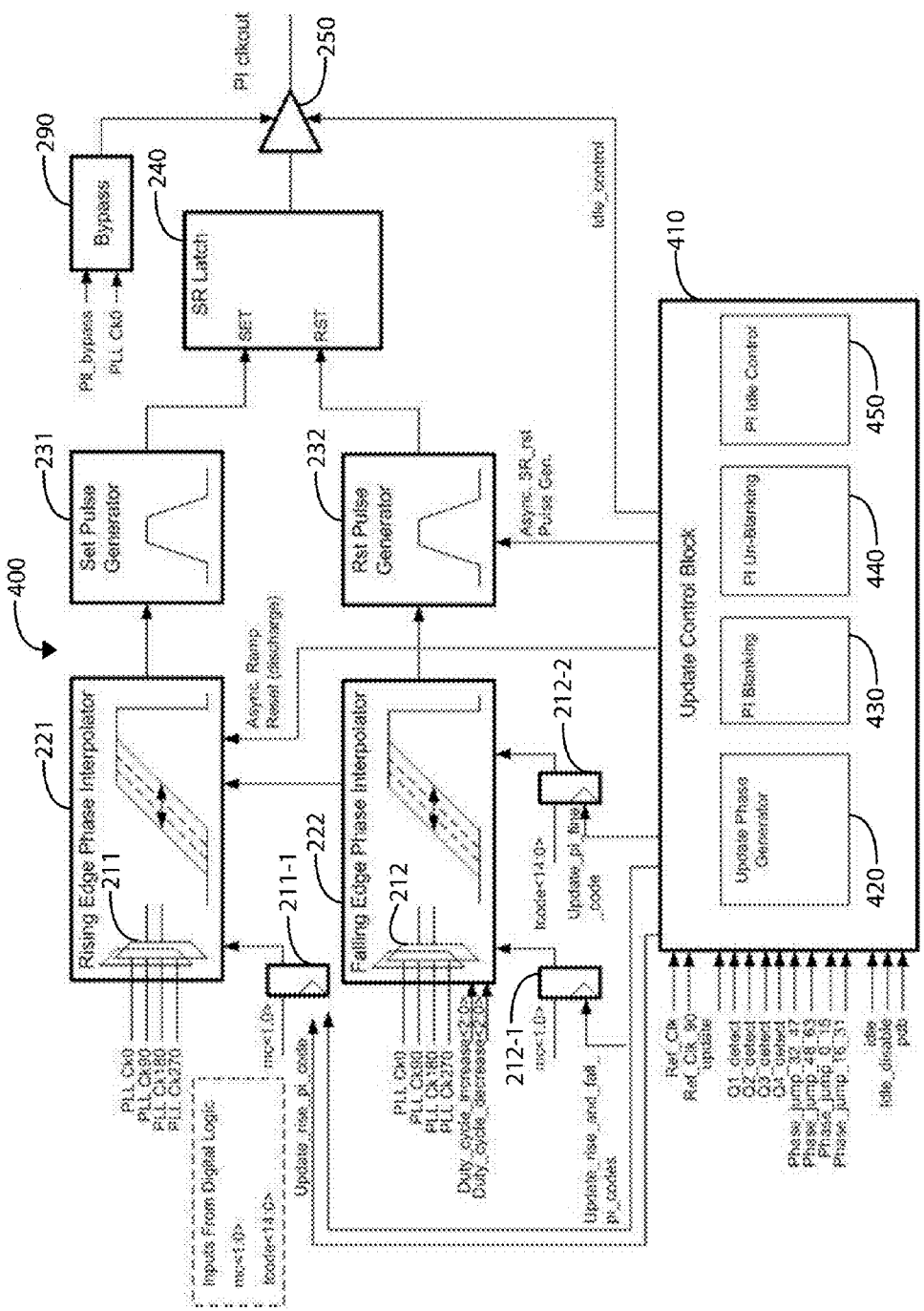
FIG. 4 is a simplified circuit block diagram illustrating a phase interpolator circuit module coupled to an update control circuit module according to an embodiment of the present invention.

FIG. 4 is a simplified circuit block diagram illustrating a phase interpolator circuit module coupled to an update control circuit module 410 according to an embodiment of the present invention. This circuit 400 can include a phase interpolator circuit module that is similar to module 200. The description for this phase interpolator circuit module can be found in the previous description for module 200 of FIG. 2. A bypass module 290, which takes in a bypass signal and a PLL clock signal, can be coupled to the output of the phase interpolator circuit module.

In an embodiment, the update control circuit module 410, or update control block, is coupled to the rising and falling edge multiplexers 211/212, to the rising and falling edge interpolators 221/222, to the reset pulse generator 232, and to the output after the SR latch 240. This update control module 410 can be configured to update the phase interpolator circuit module with a new phase code input. In a specific embodiment, the coarse phase code of the mixed code input can be provided to the rising and falling edge multiplexers 211/212 through registers 211-1/212-1, while the fine phase code can be provided to the rising and falling edge phase interpolators 221/222 through register 212-2.

In a specific embodiment, the update control circuit module 410 includes an update phase generator 420, a phase interpolator blanking module 430, a phase interpolator unblanking module 440, and a phase interpolator idle control module 450. Further details of the present method for dynamically updating a phase interpolator circuit module using an update control circuit module in a phase interpolator circuit device are described below.

Figure 5:
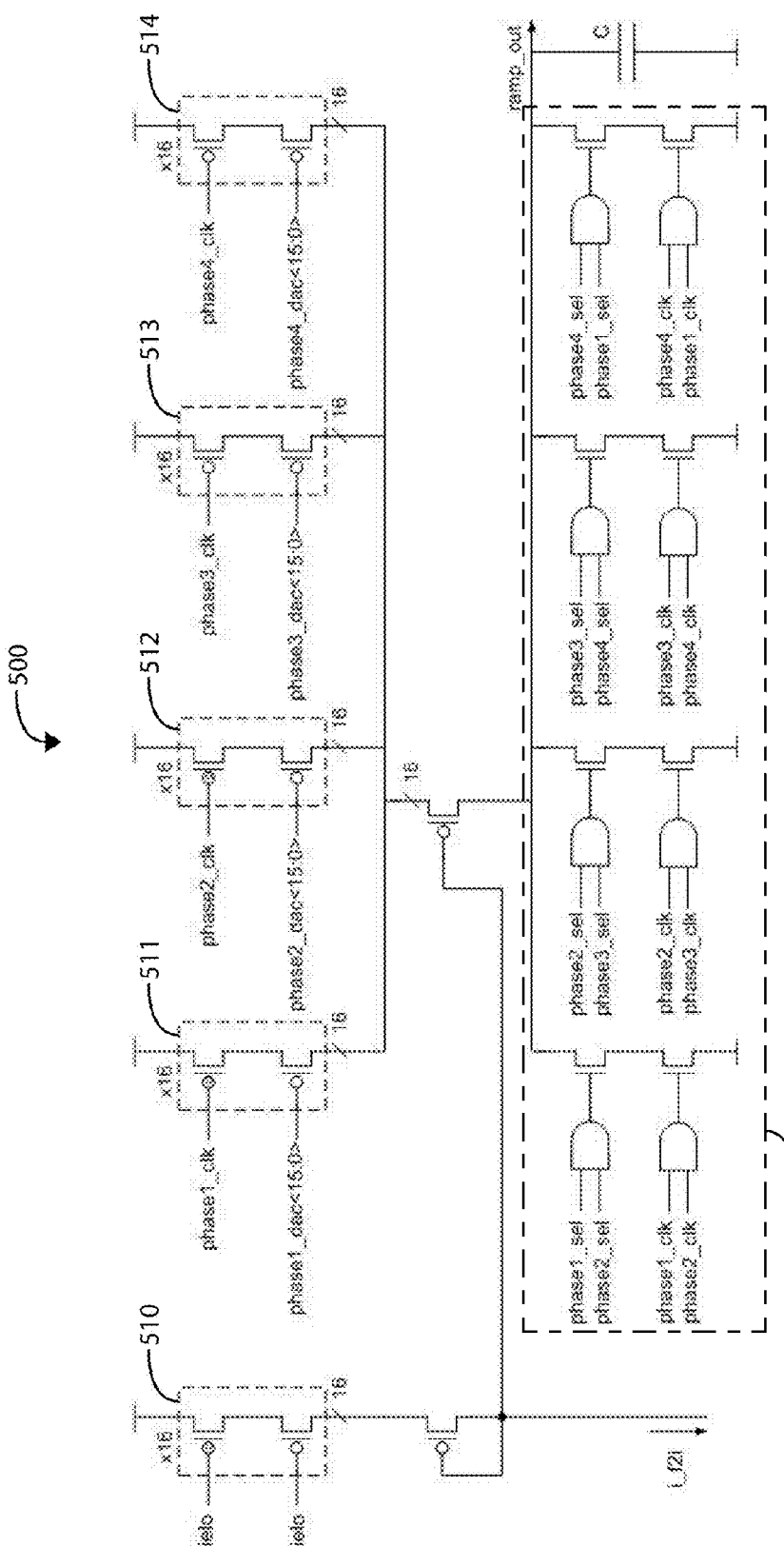
FIG. 5 is a simplified circuit block diagram of a phase interpolator ramp generator according to an embodiment of the present invention.

FIG. 5 is a simplified circuit block diagram of a phase interpolator ramp generator according to an embodiment of the present invention. As shown, the generator 500 includes a current source 510 coupled to a generator circuit with an upper portion and a lower portion 520. The upper portion includes four phase circuit portions, one for each of the four phase clock signals. Each circuit portion includes a PMOS transistor coupled to the corresponding phase clock signal and to a corresponding phase dac signal. In a specific embodiment, the phase dac signal is an array of 16 signals and each circuit portion includes sixteen branches, corresponding to each of the 16 phase dac signals. These circuit portions are coupled to another PMOS transistor, which is coupled to the current source 510 and the lower portion 520.

In a specific embodiment, the lower portion 520 includes four branches of NMOS transistors, each branch include a pair of transistors, each coupled to an "AND" logic gate. The first transistor of each branch is coupled to an "AND" logic gate that is connected to select signals for a pair of phase clock signals. The second transistor of each branch is coupled to an "AND" logic gate that is connected to the corresponding pair of phase clock signals as in the "AND" logic gate of the first transistor. As shown in FIG. 5, the branches are configured such that the pairs of phase clock signals are in consecutive order: phase clocks 1/2, phase clocks 2/3, phase clocks 3/4, and phase clocks 4/1. The top node that connects these branches is the output of the phase interpolator ramp generator.

In an embodiment, this phase interpolator ramp generator generates the phase interpolated signals like those shown in FIG. 3B using four phase clock signals like those shown in FIG. 3A. Those of ordinary skill in the art will recognize other variations, modifications, and alternatives.

Figure 6:
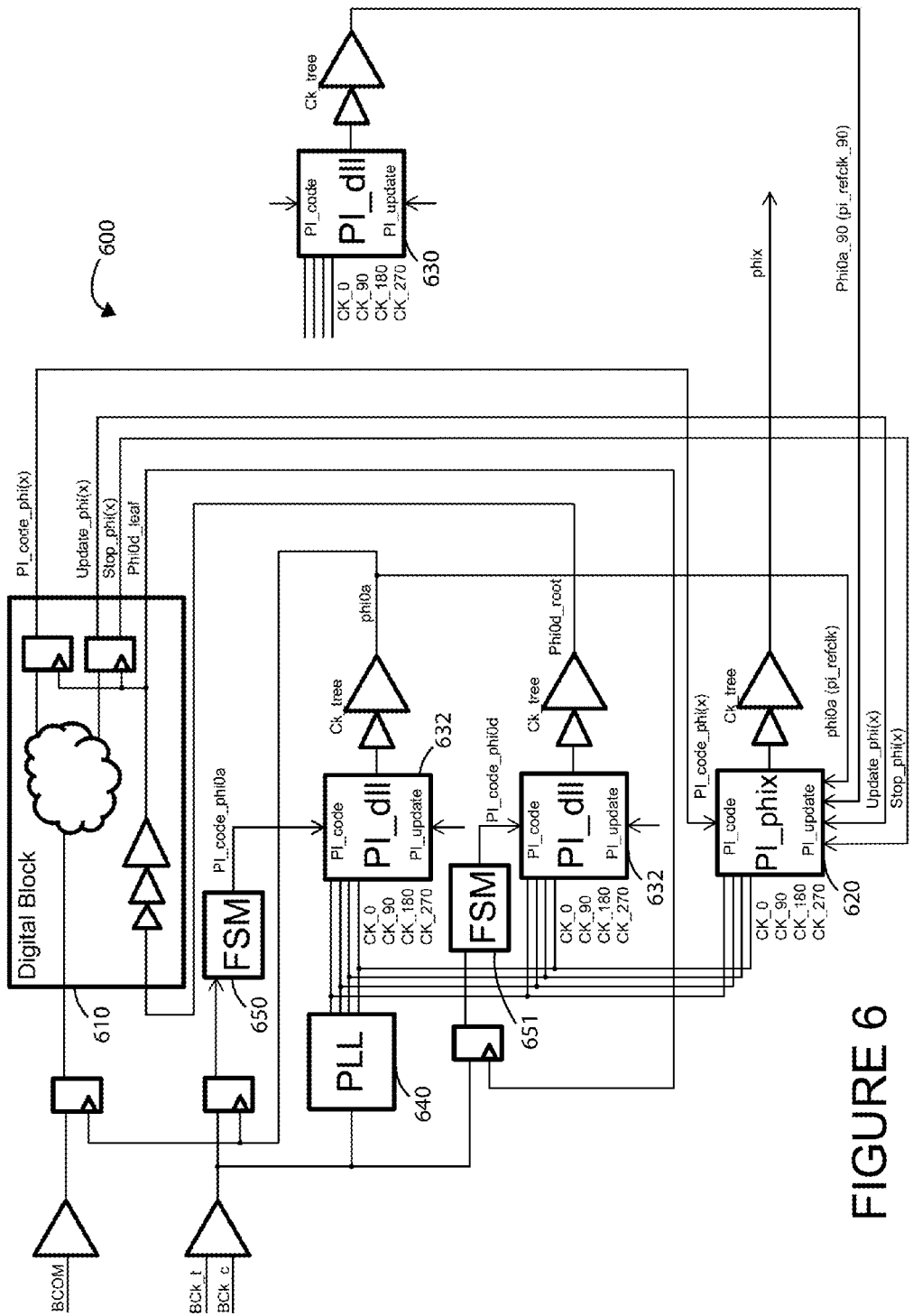
FIG. 6 is a simplified circuit block diagram of a phase interpolator circuit device according to an embodiment of the present invention.

FIG. 6 is a simplified circuit block diagram of a phase interpolator circuit device according to an embodiment of the present invention. As shown, the circuit device 600 includes a digital block 610 coupled to a phase interpolator circuit device 620, phase interpolator delay-locked loop (DLL) modules 630/631/632, and a phase-locked loop (PLL) module 640. The PLL module is coupled to each of the phase interpolator DLL modules 630/631/632 and the phase interpolator circuit device 620. The circuit device 620 can be the phase interpolator circuit module coupled to the update control circuit module described previously.

In an embodiment, finite-state machine (FSM) modules 650/651 provide the phase interpolator code inputs o the phase interpolator DLL modules, while the digital block 610 provides the phase interpolator code input to the circuit device 620. The digital block 610 also provides an update signal and a stop signal to circuit device 620. In a specific embodiment, the phase interpolator DLL module 630 provides a reference clock signal to the phase interpolator circuit device 620. Of course, there can be other variations, modifications, and alternatives.

Figure 7:
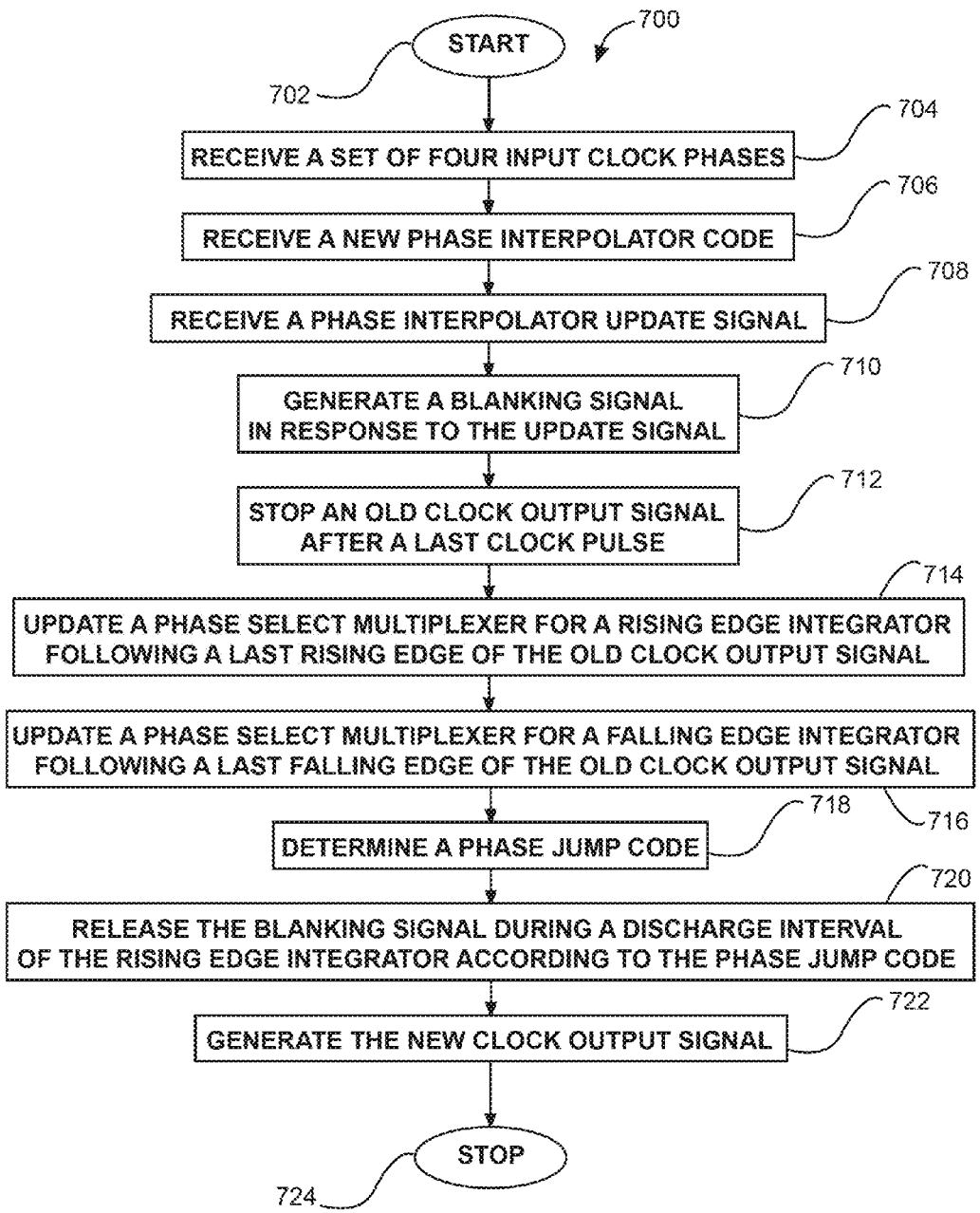
FIG. 7 is a simplified flow diagram illustrating a method for dynamically updating a phase interpolator circuit module using an update control circuit module in a phase interpolator circuit device according to an embodiment of the present invention.

FIG. 7 is a simplified flow diagram illustrating a method for dynamically updating a phase interpolator circuit module using an update control circuit module in a phase interpolator circuit device according to an embodiment of the present invention.

As shown in FIG. 7, the present method 700 can be briefly outline as provided below:
1. Start;
2. Receive a set of four input clock phases;
3. Receive a new phase interpolator code;
4. Receive a phase interpolator update signal;
5. Generate a blanking signal in response to the update signal;
6. Stop an old clock output signal after a last clock pulse in response to the blanking signal;
7. Update a phase select multiplexer for a rising edge integrator following a last rising edge of the old clock output signal;
8. Update a phase select multiplexer for a falling edge integrator following a last falling edge of the old clock output signal;
9. Determine a phase jump code;
10. Release the blanking signal during a discharge time interval of the rising edge integrator according to the phase jump code;
11. Generate the new clock output signal after the release of the blanking signal; and
12. Stop.

These steps are merely examples and should not unduly limit the scope of the claims herein. As shown, the above method provides a method of dynamically updating a phase interpolator circuit module with a new phase interpolator code input using an update control circuit module to produce a glitch-less clock signal according to an embodiment of the present invention. One of ordinary skill in the art would recognize many other variations, modifications, and alternatives. For example, various steps outline above may be added, removed, modified, rearranged, repeated, and/or overlapped, as contemplated within the scope of the invention.

Following the start, step 702, of the method, the phase interpolator can receive a set of input clock phases, step 704. This set of input clock phases can include four input clock phases nominally spaced apart by 90 degrees. The update control circuit module can receive a new phase interpolator code, step 706, and a phase interpolator update signal, step 708. The update control module can generate a blanking signal in response to the update signal, step 710, which applies the update process of the present invention.

In an embodiment, the update process can include stopping an old clock output signal of the phase interpolator module after a last clock pulse of the old clock signal in response to the blanking signal, step 712. This old clock signal is characterized by an old phase interpolator code. The update control module can then update phase select multiplexers for a rising edge integrator and falling edge integrator, both of the phase interpolator modules, according to the new phase interpolator code. The update to the rising edge integrator multiplexer follows a last rising edge of the old clock signal, step 714, while the update to the falling edge integrator multiplexer follows a last falling edge of the old clock signal, step 716.

In a specific embodiment, the stopping of the old clock output signal includes applying a blanking process to the old clock signal after the last falling edge of the old clock signal. This blanking process stops the old clock output signal after the last clock pulse finishes and allows the phase interpolator module to be updated without any clock pulse glitches. The generating of the blanking signal can include discharging a capacitor of the rising edge integrator, blocking a set input into an SR latch of the phase interpolator module, and releasing the discharge of the rising edge integrator capacitor.

In an embodiment, the update control module determines a phase jump code, step 718. This phase jump code can include a jump-to code and a jump-from code, each of which can range from 0 to 63. The phase jump code can correspond to a quadrant phase and a cycle number to provide a precise determination of the blanking phase and the start of a new phase. The phase jump code can be determined according to the difference between the new phase and the old phase using 1/64 increments of a clock cycle and can be determined to provide jump duration delays ranging from about 1.5 clock cycles to about 2.5 clock cycles. In a specific embodiment, the phase jump code is determined according to the following equation:

If ((m−n)<=31){
  If ((128+(m−n))>=96){
    Phase jump=128+(m−n);
  }
  Else {
    Phase jump=64+128+(m−n);
  }
}
Else {
  If ((64+(m−n))>=96){
    Phase jump=64+(m−n);
  }
  Else {
    Phase jump=64+64+(m−n);
  }
} where n is the old phase (0<=n<=63), m is the new phase (0<=m<=63), and Phase jump p is in units of 1/64 of a signal period (i.e., a signal period is divided into 64 units).

The update control module then releases the blanking signal during a discharge time interval of the rising edge integrator, step 720. In a specific embodiment, the releasing of the blanking signal can include releasing the set input into the SR latch of the phase interpolator module. This release of the blanking signal occurs after a phase jump duration corresponding to the phase jump code that as previously determined. In a specific embodiment, the phase jump duration ranges between about 1.5 clock cycles to about 2.5 clock cycles. The use of the phase jump code facilitates the glitch-less clock signal update by providing precisely calculated phase jump delays according to all possible interpolation conditions for the phase interpolator module. Following the blanking signal release, the phase interpolator module can generate the new clock output signal, step 722.

In an embodiment, the present method can include a stop process used alone or in combination with the update process. The update control module can receive a phase interpolator stop signal and generate a blanking signal in response to this stop signal. The update control module can then stop the old clock output signal after the last clock pulse in response to the blank signal. In this manner, the old clock output signal is inhibited until the next update process, which releases the blanking signal.

The above sequence of processes provides a method for dynamically updating a phase interpolator circuit module using an update control circuit module in a phase interpolator circuit device according to an embodiment of the present invention. As shown, embodiments of the method disclose a combination of steps including blanking the old clock signal, updating the phase interpolator with a new code input, and releasing the blanking to allow the generation of a new clock signal according to the new code input. Other alternatives can also be provided where steps are added, one or more steps are removed, or one or more steps are provided in a different sequence without departing from the scope of the claims herein. Further details of the present method can be found throughout the present specification.

Figure 8:
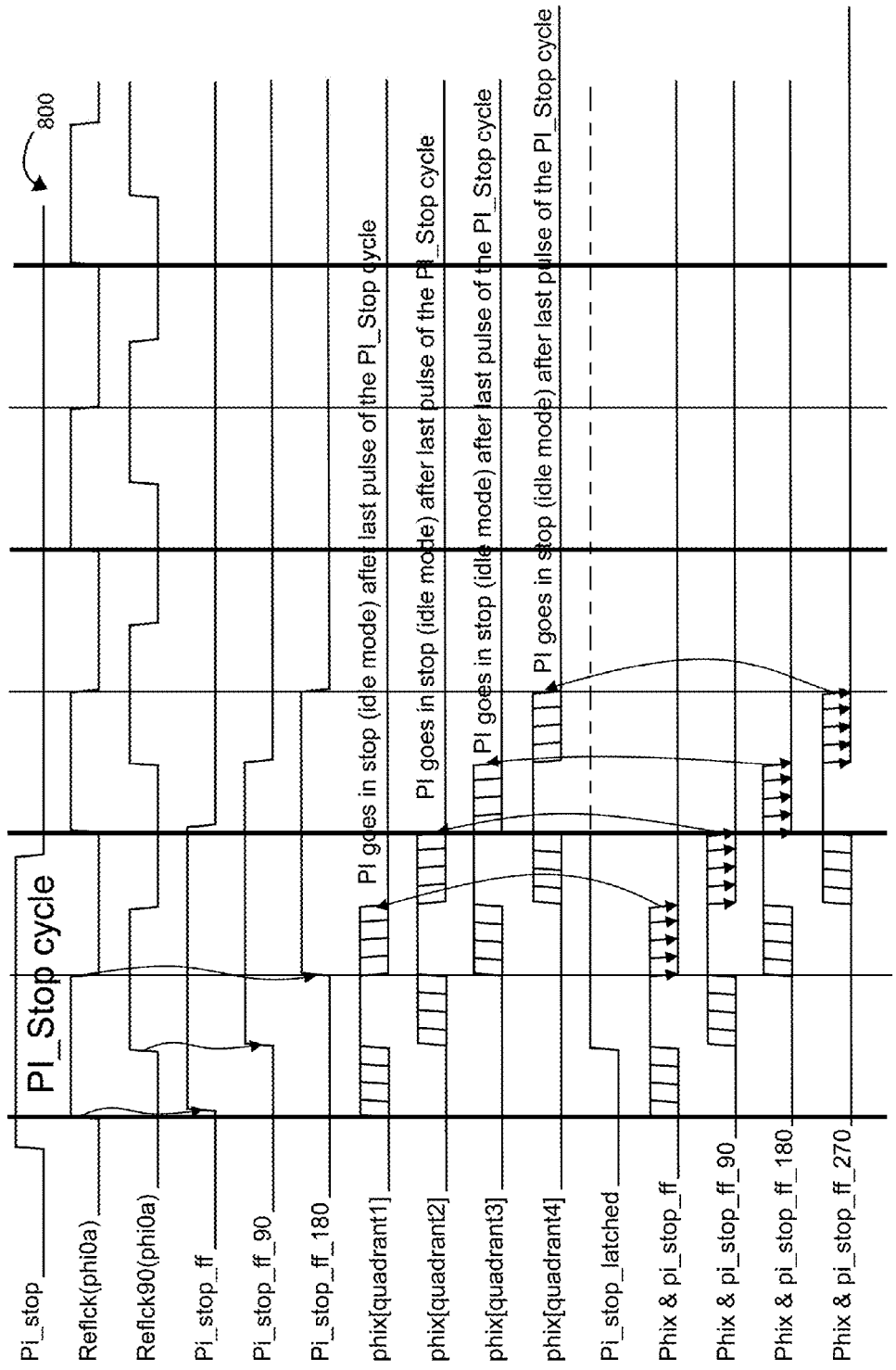
FIG. 8 is a simplified signal timing diagram illustrating the operation of a phase update circuit module according to an embodiment of the present invention.

FIG. 8 is a simplified signal timing diagram illustrating the operation of a phase update circuit module according to an embodiment of the present invention. As shown, timing diagram 800 shows an example of the stop process, or beginning of the update process, in which the old clock signal is stopped (i.e., blanked or put in idle mode). Here, the phase interpolator stop signal, a signal pulse labeled "PI_Stop cycle", is shown at the top of the diagram 800. The next two signals, "Refclk" and "Refclk90", are reference clock signals spaced 90 degrees apart. These signals provide reference to two of the four quadrature input clock phases. The "Pi_stop_latched" signal shows that the phase interpolator is latched into the stop or idle mode following the "PI_Stop cycle" described previously.

The stop signal is read at the rising edges of the input clock phases, resulting in the stop signals for each respective quadrant shown by the delayed stop pulse signals of "Pi_stop_ff", "Pi_stop_ff_90", and "Pi_stop_ff_180" ("Pi_stop_ff_270" omitted here). The next four signals, the "phix[quadrantX]" signals, show how the phase interpolator output signals for each quandrant goes into a stop or idle mode after the last pulse of the stop of the stop cycle. In a specific embodiment, the update control module waits for the last falling edge before initiating the stop mode to avoid producing a glitch at the phase interpolator output. The last four signals, the "Phix & pi_stop_ff" signals, correspond to when the stop signals are received for each quadrant and trigger the idle mode of the "phix[quadrantX]" signals described previously.

Figure 9:
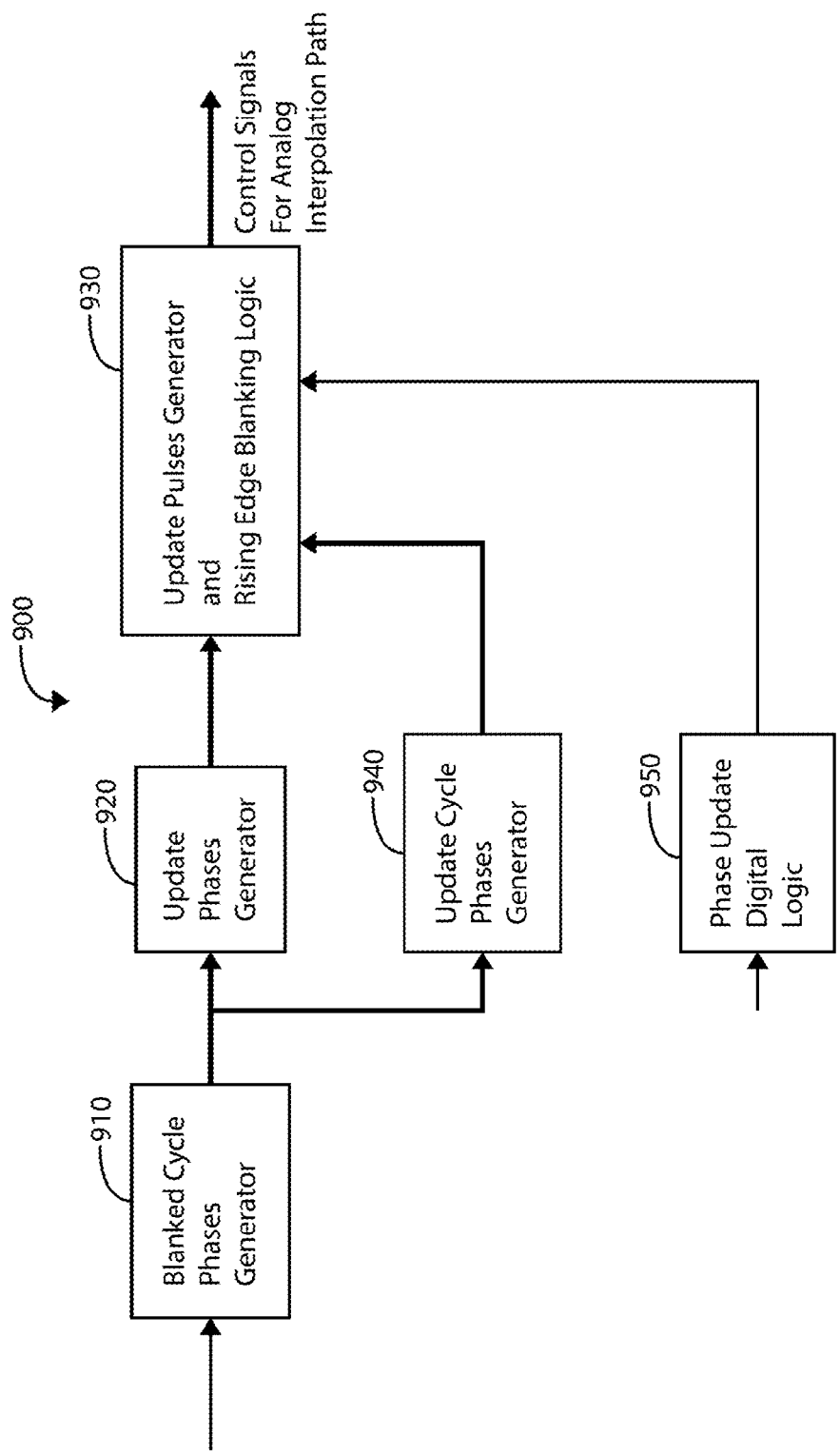
FIG. 9 is a simplified block diagram illustrating an update control circuit module according to an embodiment of the present invention.

FIG. 9 is a simplified block diagram illustrating an update control circuit module according to an embodiment of the present invention. As shown, the update control module 900 can include a blanked cycle phases generator 910 coupled to an update phases generator 920 and an update cycle phases generator 940. The update cycle phases generator 940, a phase update digital logic module 950, and the update phases generator 920 are all coupled to an update pulses generator and rising edge blanking logic module 930, which provides an output control signals for an analog interpolation path for the phase interpolator circuit device.

In a specific embodiment, these modules collectively provide the stop and update processes used in the dynamic updating of the phase interpolator circuit module. The blanked cycle phases generator 910 generates the blanked cycles and provides the reference clock signals to be used in the update phase generator 920 and the update cycle phases generator 940. The update phases generator 920 generates the update signals for the four quadrants of the phase interpolator outputs. The phase update digital logic module 950 calculates the phase jump code, which corresponds to a quadrant and a phase, while the update cycle phases generator 940 generates the update cycle phases according to combinations of cycles (0-3) and quadrants (1-4). The outputs of all these modules are fed into the update pulses generator and rising edge blanking logic module 930, which provide the blanking signals and update the rising and falling edge integrators and multiplexers described previously.

The present invention provides a phase interpolation update circuit device configured for dynamically updating a phase interpolator circuit module using an update control circuit module. The phase interpolator circuit module can include a rising edge multiplexer configured with a set of input clock phases including four input clock phases nominally spaced apart by 90 degrees, a rising edge interpolator coupled to the rising edge multiplexer and being configured to the phase interpolator code input, a set pulse generator coupled to the rising edge interpolator, a falling edge multiplexer configured with the set of input clock phases and the phase interpolator code input, a falling edge interpolator coupled to the falling edge multiplexer and being configured to the phase interpolator code input, a reset pulse generator coupled to the falling edge interpolator, and an SR latch coupled to the set pulse generator and the reset pulse generator.

In an embodiment, the update control circuit module having a phase interpolator code input and a phase interpolator update signal input. The update control circuit module can include a blanked cycle phases generator, an update phases generator coupled to the blanked cycle phases generator, an update cycle phases generator coupled to the blanked cycle phases generator, a phase update digital logic module configured to determine a phase jump code, and an update control logic module coupled to the update phases generator, the update cycle phases generator, and the phase update digital logic module.

The update control logic module can be configured to generate a blanking signal in response to the phase interpolator update signal input, the update control logic module being configured to stop an old clock output signal of the phase interpolator circuit module in response to the blanking signal, the update control logic module being configured to update the rising edge multiplexer according to the phase interpolator code input, update the falling edge multiplexer according to the phase interpolator code input, and release the blanking signal during a discharge time interval of the rising edge integrator after a phase jump duration corresponding to the phase jump code. The phase interpolator circuit module can be configured to generate a new clock output signal after the update control logic module releases the blanking signal.

In a specific embodiment, the update control circuit module includes a phase interpolator stop signal input. The update control logic module is configured to generate the blanking signal in response to the phase interpolator stop signal input, and stop the old clock output of the phase interpolator circuit module after the last clock pulse of the old clock output signal in response to the blanking signal.

Figure 10:
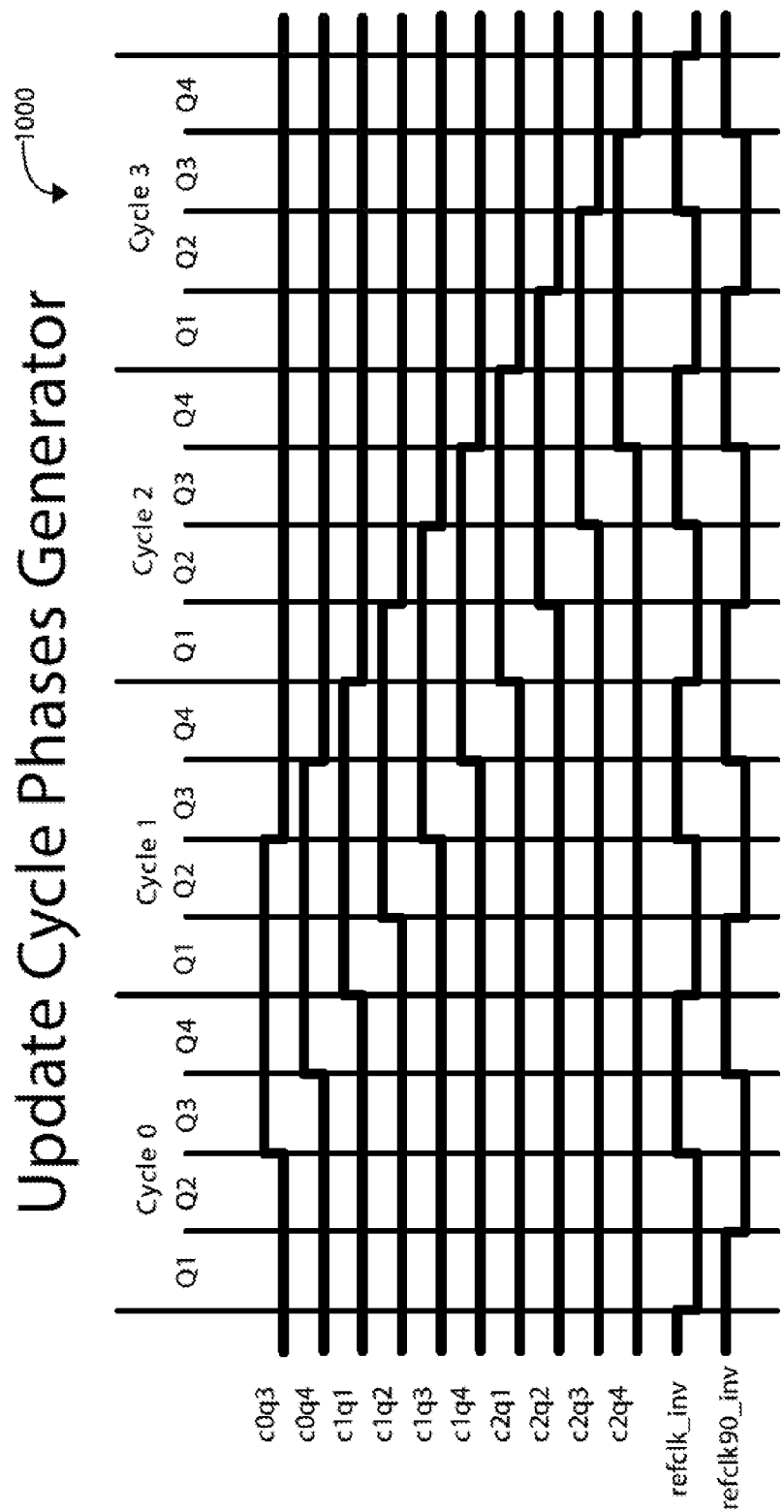
FIG. 10 is a simplified timing diagram illustrating the operation of an update phases cycle generator of an update control circuit module according to an embodiment of the present invention.

FIG. 10 is a simplified timing diagram illustrating the operation of an update phases cycle generator of an update control circuit module according to an embodiment of the present invention. This update phases cycle generator can represent an example of the update phases cycle generator described previously in FIG. 9. As shown, timing diagram 1000 displays a set of update cycle phases corresponding specific combinations of cycles (0-3) and quadrants (1-4). Reference clocks "refclk_inv" and "refclk90_inv", spaced 90 degrees apart, are also shown in the timing diagram, along with the "Update_latched" signal showing when the update signal to the update control module is received.

Figure 11:
FIG. 11 is a simplified timing diagram illustrating a method for dynamically updating a phase interpolator circuit module using an update control circuit module in a phase interpolator circuit device according to an embodiment of the present invention.

FIG. 11 is a simplified timing diagram illustrating a method for dynamically updating a phase interpolator circuit module using an update control circuit module in a phase interpolator circuit device according to an embodiment of the present invention. As shown, timing diagram 1100 includes a set of signals illustrating both a stop process followed by an update process (output signal 1120) and just an update process (output signal 1150). Signal 1101 is a stop/idle signal and signal 1102 is a stop/idle signal following a register. Signal 1103 is the combination of signals 1101 and 1102 (i.e., the 'OR' logic operation of signals 1101 and 1102). Signals 1104 and 1105 are phase shifted forms of signal 1103 by 90 and 180 degrees, respectively. Signal 1110 is a reference clock signal and signal 1160 represents measurements of phase settings.

Signals 1131, 1132, and 1133 produce the stop process to blank the phase interpolator output signal 1120. Signal 1131 tells the phase interpolator to stop after the last falling edge, which causes a subsequent phase of signal 1120 to be blanked. Signal 1132, the inverse of signal 1131, and signal 1133 set the phase interpolator circuit module in idle mode. Signal 1141 is an update signal. Following the update signal 1141, a ramp discharge signal 1142 is activated. The blanking on the phase interpolator output is then released to allow the generation of the output clock signal on the next discharge of the rising edge integrator of the phase interpolator. The result of this process is shown in output signal 1120 where the clock signal resumes.

Output signal 1150 shows the effect of only applying the update process according to the update signal. Compared to output signal 1120, the blanking process is not initiated until after the update signal 1141 following the last falling edge of the last clock pulse. Following the falling edge of the ramp discharge signal, the output signal 1150 resumes just like the output signal 1120. The resumed output clock signals in signals 1120 and 1150 would be characterized according to the new phase interpolator code. Here, the update process was applied immediately following the stop process in signal 1120, but the update process could be applied at a later point in time, resulting in a longer blanking process applied to the output.

Many benefits are recognized through various embodiments of the present invention. Such benefits include a quick and efficient technique for updating a phase interpolator circuit module substantially free from signal glitches that can render the device non-functional. With fast, glitch-free output phase switching and clock gating, the phase interpolator circuit device can produce a plurality of clock outputs quickly and accurately. The phase interpolator circuit device of the present invention also exhibits high linearity; low period, cycle-to-cycle, and half period jitter; low static duty cycle distortion; low insertion delay variation; as well as others. Other benefits will be recognized by those of ordinary skill in the art that the mechanisms described can be applied to other IC systems as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for dynamically updating a phase interpolator circuit module using an update control circuit module coupled to the phase interpolator circuit module, the method comprising:
   receiving, in the phase interpolator circuit module, a set of input clock phases including four input clock phases nominally spaced apart by 90 degrees;
   receiving, in the update control circuit module, a new phase interpolator code;
   receiving, in the update control circuit module, a phase interpolator update signal;
   generating, in the update control circuit module, a blanking signal in response to the phase interpolator update signal;
   stopping, by the update control circuit module, an old clock output signal of the phase interpolator circuit module after a last clock pulse of the old clock output signal in response to the blanking signal, the old clock output signal being characterized by an old phase interpolator code;
   updating, by the update control circuit module, a phase select multiplexer for a rising edge integrator in the phase interpolator circuit module according to the new phase interpolator code following a last rising edge of the old clock output signal;
   updating, by the update control circuit module, a phase select multiplexer for a falling edge integrator in the phase interpolator circuit module according to the new phase interpolator code after a last falling edge of the old clock output signal characterized by the old phase interpolator code;
   determining, in the update control circuit module, a phase jump code;
   releasing, by the update control circuit module, the blanking signal during a discharge time interval of the rising edge integrator, the releasing of the blanking signal being after a phase jump duration corresponding to the phase jump code;
   generating, in the phase interpolator circuit module, the new clock output signal after the releasing of the blanking signal.

2. The method of claim 1 wherein stopping the old clock output signal after the last clock pulse includes applying a blanking process to the old clock output signal after the last falling edge of the old clock output signal;
   wherein the blanking process stops the old clock output signal after the last clock pulse finishes.

3. The method of claim 1 generating the blanking signal in the update control circuit module includes:
   discharging a capacitor of the rising edge integrator;
   blocking a set input into an SR latch of the phase interpolator circuit module; and
   releasing the discharge of the rising edge integrator capacitor.

4. The method of claim 3 wherein releasing the blanking signal in the update control circuit module includes releasing the set input into the SR latch of the phase interpolator circuit module.

5. The method of claim 1 further comprising
receiving, in the update control circuit module, a phase interpolator stop signal;
generating, in the update control circuit module, the blanking signal in response to the phase interpolator stop signal; and
stopping, by the update control circuit module, the old clock output signal of the phase interpolator circuit module after the last clock pulse of the old clock output signal in response to the blanking signal.

6. The method of claim 1 wherein determining the phase jump code includes determining the phase jump code according to the following equation:

```
If ((m-n)<=31){
   If ((128+(m-n))>=96){
      Phase jump=128+(m-n);
   }
   Else {
      Phase jump=64+128+(m-n);
   }
}
Else {
   If ((64+(m-n))>=96){
      Phase jump=64+(m-n);
   }
   Else {
      Phase jump=64+64+(m-n);
   }
}
``` where n is the old phase ($0<=n<=63$), m is the new phase ($0<=m<=63$), and Phase jump p is in units of $1/64$ of a signal period.

7. The method of claim 1 wherein the phase jump code corresponds to a quadrant phase and a cycle number.

8. The method of claim 1 wherein the phase jump code includes a jump-to code and a jump-from code, wherein each of the jump-to code and the jump-from code ranges from 0 to 63.

9. The method of claim 1 wherein the phase jump duration ranges between about 1.5 clock cycles and about 2.5 clock cycles.

10. The method of claim 1 wherein the phase jump duration corresponding to the phase jump code is configured to release the blanking signal during the discharge time interval before a first rising edge of the new clock output signal according to the new phase interpolator code.

11. A phase interpolation update circuit device configured for dynamically updating a phase interpolator circuit module using an update control circuit module, the device comprising:
the phase interpolator circuit module comprising
a rising edge multiplexer configured with a set of input clock phases including four input clock phases nominally spaced apart by 90 degrees,
a rising edge interpolator coupled to the rising edge multiplexer and being configured to the phase interpolator code input,
a set pulse generator coupled to the rising edge interpolator,
a falling edge multiplexer configured with the set of input clock phases and the phase interpolator code input,
a falling edge interpolator coupled to the falling edge multiplexer and being configured to the phase interpolator code input,
a reset pulse generator coupled to the falling edge interpolator, and
an SR latch coupled to the set pulse generator and the reset pulse generator;
the update control circuit module having a phase interpolator code input and a phase interpolator update signal input, the update control circuit module comprising
a blanked cycle phases generator,
an update phases generator coupled to the blanked cycle phases generator,
an update cycle phases generator coupled to the blanked cycle phases generator,
a phase update digital logic module configured to determine a phase jump code, and
an update control logic module coupled to the update phases generator, the update cycle phases generator, and the phase update digital logic module;
wherein the update control logic module is configured to generate a blanking signal in response to the phase interpolator update signal input,
the update control logic module being configured to stop an old clock output signal of the phase interpolator circuit module in response to the blanking signal,
the update control logic module being configured to update the rising edge multiplexer according to the phase interpolator code input,
the update control logic module being configured to update the falling edge multiplexer according to the phase interpolator code input,
the update control logic module being configured to release the blanking signal during a discharge time interval of the rising edge integrator after a phase jump duration corresponding to the phase jump code; and
wherein the phase interpolator circuit module is configured to generate a new clock output signal after the update control logic module releases the blanking signal.

12. The device of claim 11 wherein the update control logic module is configured to apply a blanking process to the old clock output signal after the last falling edge of the old clock output signal;
wherein the blanking process stops the old clock output signal after the last clock pulse finishes.

13. The device of claim 11 wherein the update control logic module is configured to discharge a capacitor of the rising edge integrator, the update control logic module being configured to block a set input into the SR latch, and the update control logic module being configured to release the discharge of the rising edge integrator capacitor.

14. The device of claim 13 wherein the update control logic module is configured to release the set input into the SR latch upon releasing the blanking signal.

15. The device of claim 11 wherein the update control circuit module includes a phase interpolator stop signal input, and wherein the update control logic module is configured to generate the blanking signal in response to the phase interpolator stop signal input, the update control logic module being configured to stop the old clock output of the phase interpolator circuit module after the last clock pulse of the old clock output signal in response to the blanking signal.

16. The device of claim 11 wherein the phase update digital logic module is configured to determine the phase jump code according to the following equation:

```
If ((m−n)<=31){
   If ((128+(m−n))>=96){
      Phase jump=128+(m−n);
   }
   Else {
      Phase jump=64+128+(m−n);
   }
}
Else {
   If ((64+(m−n))>=96){
      Phase jump=64+(m−n);
   }
   Else {
      Phase jump=64+64+(m−n);
   }
}
``` where n is the old phase (0<=n<=63), m is the new phase (0<=m<=63), and Phase jump p is in units of $\frac{1}{64}$ of a signal period.

17. The device of claim 11 wherein the phase jump code corresponds to a quadrant phase and a cycle number.

18. The device of claim 11 wherein the phase jump code includes a jump-to code and a jump-from code, wherein each of the jump-to code and the jump-from code ranges from 0 to 63.

19. The device of claim 11 wherein the phase jump duration ranges between about 1.5 clock cycles and about 2.5 clock cycles.

20. The device of claim 11 wherein the update control logic module is configured to release the blanking signal during the discharge time interval before a first rising edge of the new clock output signal using the phase jump duration.

* * * * *